United States Patent [19]

Glocker et al.

[11] Patent Number: 4,892,634

[45] Date of Patent: Jan. 9, 1990

[54] METHOD OF PREPARING THERMO-MAGNETO-OPTIC RECORDING ELEMENTS

[75] Inventors: David A. Glocker, W. Henrietta, N.Y.; Geoffrey C. Lesh, Sunnyvale, Calif.

[73] Assignee: Eastman Kodak Company, Rochester, N.Y.

[21] Appl. No.: 252,322

[22] Filed: Oct. 3, 1988

[51] Int. Cl.⁴ .............................................. C23C 14/34
[52] U.S. Cl. .......................... 204/192.15; 204/192.2; 427/129
[58] Field of Search ............. 204/192.15, 192.2, 192.3; 156/646, 648, 668; 428/900; 427/128, 129, 38, 39

[56] References Cited

U.S. PATENT DOCUMENTS

| | | | |
|---|---|---|---|
| 4,610,912 | 9/1986 | Takahashi et al. | 428/900 X |
| 4,719,154 | 1/1988 | Hatwar | 428/694 |
| 4,735,698 | 4/1988 | Nomura et al. | 204/192.2 |
| 4,737,408 | 4/1988 | Kuwahara et al. | 428/335 |
| 4,761,334 | 8/1988 | Sagoi et al. | 428/332 |
| 4,762,742 | 8/1988 | Sonoda et al. | 428/141 |
| 4,786,559 | 11/1988 | Murakami et al. | 428/472 |

Primary Examiner—Nam X. Nguyen
Attorney, Agent, or Firm—Robert A. Gerlach

[57] ABSTRACT

A method of making a thermo-magneto-optic element stable over wide temperature ranges wherein a barrier layer is applied to a polymeric substrate, the substrate is first exposed to an RF oxygen plasma treatment at a power of from about 50 to about 200 watts and a time of from about 5 to about 200 seconds.

10 Claims, 1 Drawing Sheet

METHOD OF PREPARING THERMO-MAGNETO-OPTIC RECORDING ELEMENTS

BACKGROUND OF THE INVENTION

This invention relates to thermo-magneto-optic recording elements and, more particularly to a method of preparing thermo-magneto-optic elements.

As used herein, the term "thermo-magneto-optic (TMO) recording element" refers to a multi-layer structure used in the thermo-magneto-optic write/read process for selectively modifying the characteristic of an incident polarized light beam in accordance with a magnetization pattern formed in the TMO recording layer which is one of the layers of the recording element. Typically such recording elements include a substrate, a thermo-magneto-optic recording layer and one or more corrosion-preventing and/or anti-reflection layers of a dielectric or semi-conductive material. When the TMO layer is a rare-earth transition metal layer, a corrosion-preventing layer is required on either side of the TMO layer in order to prevent deterioration and ultimate destruction of the magneto-optic properties of the TMO layer. It is desirable that this corrosion-preventing layer also serve as an anti-reflection layer.

A preliminary function of the anti-reflection layer in a TMO recording element is to enhance the rotation angle $\Theta_K$ caused by the Kerr effect (in reflective systems) and Faraday effect (in transmission systems). This enhancement is of importance because the degree of rotation of a polarized collimated beam of light capable of being read out of a TMO device is extremely small, in most cases, less than a fraction of a degree. Thus, the signal to noise ratio of the readout signal requires enhancement. As indicated above, it is desired that the anti-reflective layer serves the dual function of enhancing the rotation angle and also preventing corrosion of the TMO layer. Thus, an anti-reflection corrosion preventing dielectric or semi-conductive material layer is required between the substrate and the rare-earth transition metal TMO layer. Such structures are described in an article published in the Japanese Journal of Applied Electronics, Vol. 8, No. 2, page 93-96 entitled "Study on High Reliability of a Magneto-Optic Medium With A Multi-Layer Structure" authored by K. Ohta et al. (1984) and in U.S. Pat. No. 4,719,154 by T. K. Hatwar which is assigned to the same assignee as this immediate application.

A problem that exists in a structure having a corrosion prevention, anti-reflection layer between a polymer substrate and the TMO layer is that upon being subjected to large changes in temperature, buckling and delamination between the polymer substrate layer and the corrosion preventing, anti-reflection layer occurs thereby either rendering the recording element inaccurate or totally inoperative. In other words, the structure consisting of the substrate and film package, must survive temperature excursions from approximately +60° C. to -40° C. in order to withstand shipping and use conditions. It is believed that the delamination or buckling that occurs between the substrate and the adjacent corrosion resistant, anti-reflection layer is due to stresses in the layers caused by the different thermal expansion coefficients of these two adjacent layers. Such deformities cannot be tolerated in a thermo-magneto-optic recording element because of the very small changes in rotation of the collimated polarized light beam used in the readout operation.

SUMMARY OF THE INVENTION

This invention provides a method of making a thermo-magneto-optic recording element free of buckling and delamination upon exposure to a wide variation in temperature by providing a polymeric support member, treating said support member with an oxygen plasma treatment, sputtering a first ceramic barrier layer onto the support member, applying a thermo-magneto-optic layer to the first ceramic barrier layer and sputtering a second ceramic barrier layer onto said thermo-magneto-optic layer. It has been found that by treating the polymeric substrate initially with an oxygen plasma treatment prior to the application of the first ceramic barrier layer that delamination and buckling are prevented when the recording element is subjected to large changes in temperature, such as, when the device is shipped to its ultimate destination.

BRIEF DESCRIPTION OF THE DRAWING

The sole FIGURE is a diagrammatic view of a cross-section of a thermo-magneto-optic recording element prepared in accordance with this invention.

DETAILED DESCRIPTION OF PREFERRED EMBODIMENTS

Figure 1:
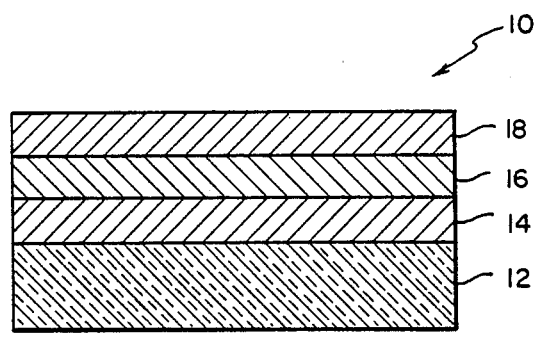

Referring to the figure, a thermo-magneto-optic element 10 includes a polymeric substrate 12, a corrosion-preventing, anti-reflection ceramic barrier layer 14 applied to and contiguous with the substrate 12, a thermo-magneto-optic layer 16 applied to the ceramic layer 14 and a second ceramic barrier layer 18 applied to the opposite surface of the thermo-magneto-optic layer 16.

With regard to the substrate, any suitable polymeric material may be employed such as, for example, acrylic resins such as polymethylmethacrylate, polycarbonate resins, polyethylene terephthalate polyester resins and the like. When the thermo-magneto-optic layer is addressed by the laser beam in either the read or write mode through the substrate, the substrate must be transparent. Polycarbonate and polymethylmethacrylate polymers are the preferred substrate materials for use as the substrate.

As indicated above, barrier layers 14 and 18 may serve as corrosion preventing layers, as anti-reflection layers or these layers may have the dual capacity to serve for each of these functions. Regardless of the function of layer 14, it is essential that a barrier layer be applied to the substrate 12 for one or the other reason. This creates the problem spoken of above of buckling or delamination as a result of what is believed to be the different thermal coefficient of expansion of the two layers 12 and 14. Suitable materials for the preparation of layers 14 and 18 include the nitrides and carbides of aluminum, silicon, titanium, and boron. Of these materials aluminum nitride is highly preferred because it possesses excellent characteristics to serve both as a corrosion preventative layer as well as an anti-reflective layer which improves the Kerr rotation angle of the thermo-magneto-optic layer 16.

While any material that exhibits a magneto-optic effect, particularly the Kerr effect may be employed in the preparation of thermo-magneto-optic layer 16, particular rare-earth transition metal alloys that have been known to possess this capability include Tb-Fe, Dy-Fe, Gd-Tb-Fe, Gd-Tb-Dy-Fe, Gd-Co, Tb-Fe-Co or the like. Of these materials, terbium iron cobalt alloys are preferred for use as the thermo-magneto-optic layer 16 because of the large Kerr rotation angle that results and also because of the curie temperature that can be obtained using particular alloy compositions.

While any of the materials set forth immediately above can be employed in the method of making thermo-magneto-optic recording elements in accordance with this invention, and all of the materials above exhibit unwanted buckling and delamination when exposed to wide variations of temperature, for purposes of simplicity, reference will be made to a polycarbonate substrate 12, an aluminum nitride barrier layer 14 and a terbium iron cobalt thermo-magneto-optic layer 16 throughout the remainder of the specification.

The polycarbonate substrate employed in accordance with this invention may be in the form of a continuous sheet which is processed to prepare thermo-magneto-optic recording elements and then cut into the appropriate configuration when finished, such configuration generally being in the form of disks having a given diameter such as, for example, 3½ inches. It is preferred, however, that the substrate be first cut into a suitable size (3½ inch disks) and then utilized in the practice of this invention.

While it is not essential for the practice of this invention, it is highly preferred that the substrate here being in the form of disks be first baked at a temperature of less than 100° C. and preferably at a temperature of from about 40° C. to about 60° C. when polycarbonate is employed. This bake of the substrate should be for a period of time of at least about 60 minutes and preferably from about 120 to about 480 minutes in order to achieve the reduction of moisture content of the polycarbonate substrate to a desirable level.

The disk or disks are next inserted into a vacuum system which contains an RF electrode and an oxygen inlet. A vacuum of from about $10^{-4}$ to about $10^{-6}$ Torr is drawn and then oxygen is introduced to a pressure of from about 1 to about 100 milliTorr preferably from about 10 to about 50 milliTorr. Oxygen plasma treatment is then initiated by energizing of the RF electrode at a power of from about 30 to about 200 watts preferably from about 50 to about 125 watts for from about 5 to about 180 seconds, preferably from about 5 to about 20 seconds such that the power-time multiple is from about 150 to about 36000 watt seconds, preferably from about 250 to about 2500 watt seconds. It has been found that should the power-time multiple not reach the minimum value stated above, no advantage is observed with regard to the buckling/delamination problem. On the other hand, when the upper limit of the power-time multiple is exceeded, the advantage gained by the plasma treatment of the substrate is lost.

The RF electrode may be in the form of a coil or simply a plate connected to the RF source. By "oxygen plasma treatment" is meant either oxygen etch or oxygen glow discharge depending upon whether the substrate being treated is on the driven RF electrode or the counter electrode respectively.

It has been observed that when the oxygen plasma treatment is conducted in accordance with this invention the problem with buckling is completely removed. When polycarbonate substrate samples are utilized directly without the plasma treatment, an average of close to 50 buckles per field of view in a microscope is observed.

Following the plasma treatment, the barrier layer 14 is applied by any suitable technique. U.S. Pat. No. 4,719,194 issued to T. K. Hatwar on Jan. 12, 1988 and assigned to the same assignee as this immediate application, which is incorporated herein by reference, discloses a sputtering method of applying an aluminum nitride film to a substrate.

In addition to the RF magnetron sputtering system disclosed in the previously mentioned U.S. Patent, other suitable techniques may be employed for depositing the barrier layer 14 in accordance with this invention, such as, DC reactive sputtering. In this operation the same vacuum system employed for the plasma treatment of the polycarbonate substrate may be utilized and the deposition of the aluminum nitride layer 14 can be employed in a single pump down of this vacuum system. In the preparation of the barrier layer 14, the vacuum system is initially pumped down to a pressure of less than $10^{-6}$ Torr. An inert gas, such as for example, argon, krypton or the like, is introduced to achieve a partial pressure of from about 1.5 to about 12 milliTorr and the target is ignited at a power of from about 1.5 to about 7.5 kilowatts by a standard DC magnetron power supply. In the deposition of aluminum nitride, for example, nitrogen would be next introduced into the vacuum system in order to achieve a partial pressure of from about 1 to about 4 milliTorr and the inert gas, i.e. argon and nitrogen partial pressures are maintained during the deposition. The polycarbonate substrate may be scanned in front of the aluminum target for a given period to achieve the predetermined desired thickness. The thickness of the aluminum nitride layer on the polycarbonate substrate should be from about 500 to about 1500 angstroms, preferably from about 800 to 1000 angstroms and for optimum results, 900 angstroms is preferred.

In the application of the thermo-magneto-optic layer 16 to the surface of the barrier layer 14, any suitable technique for the deposition of the TMO layer may be used including that disclosed in the previously mentioned Patent to Hatwar and also U.S. Pat. No. 4,670,353 issued June 2, 1987, both of which are incorporated herein by reference.

In a specific embodiment of the invention, a 3½ inch polycarbonate disk injection molded from polycarbonate supplied by Teijin is baked in an oven at a temperature of 60° C. for 240 minutes. This disk is inserted into a vacuum system which is then pumped down to a pressure of $10^{-6}$ Torr. Oxygen is introduced into the system to achieve a pressure of 10 milliTorr and a RF plate is actuated in order to cause a glow discharge, the coil being energized by a power of 100 watts for 10 seconds at which time it is de-energized. The vacuum system is then pumped down to a pressure of at least $10^{-6}$ Torr and argon gas is introduced to a partial pressure of 3.2 milliTorr. An aluminum sputtering target contained within the vacuum system is ignited at a power of 7.5 kilowatts by a standard DC magnetron power supply. Nitrogen is then introduced at a flow rate which produces a nitrogen partial pressure of 1 milliTorr and the argon and nitrogen partial pressures are maintained during the deposition.

These conditions result in a deposition rate of aluminum nitride of approximately 60 angstroms per second. The polycarbonate substrate is scanned in front of the target at a speed determined by the desired thickness. A thickness of 900 angstroms is achieved by a speed of 55 centimeters per minute.

A terbium iron cobalt layer 16 is applied to the exposed surface of the aluminum nitride layer, prepared in accordance with the discussion immediately above by following the procedure of Example 1 of U.S. Pat. No. 4,670,353. An aluminum nitride layer 18 is next applied to the exposed surface of the terbium-iron-cobalt layer by the same procedure described above for the application of the aluminum nitride layer 14 to the polycarbonate substrate 12.

It is, of course, to be understood that any of the materials described previously may be utilized in an example in the same fashion as that described in the specific embodiment set forth. For example, other materials suitable for forming a barrier layer may be deposited in a similar matter and other TMO materials may be applied thereto.

What is claimed is:

1. In a method of making a thermo-magneto-optic recording element by applying a first ceramic barrier layer contiguous to a polymeric substrate, applying a thermo-magneto-optic layer on the surface of the barrier layer opposite to that in contact with the substrate and applying a second barrier layer to the surface of the thermo-magneto-optic layer opposite to the surface in contact with the first barrier layer, the improvement which comprises subjecting the substrate, prior to the application thereto of the first barrier layer, to an RF oxygen plasma glow discharge or etch treatment at a power of from about 30 to about 200 watts for a period of time of from about 5 to about 180 seconds, the multiple of power and time not to exceed 2500 watt-seconds.

2. The method of claim 1 wherein the power employed is from about 75 to about 125 watts and the time is from about 5 to about 20 seconds.

3. The method of claim 1 wherein the barrier layer applied to the polymeric substrate is a corrosion preventing layer.

4. The method of claim 1 wherein the barrier layer applied to the polymeric substrate is an antireflection layer.

5. The method of claim 1 wherein the barrier layer applied to the polymeric substrate is a nitride or carbide of aluminum, silicon, titanium or boron.

6. The method of claim 1 wherein the barrier layer applied to the polymeric substrate is aluminum nitride applied by sputtering.

7. The method of claim 1 wherein the polymeric substrate is polycarbonate or polymethylacrylate.

8. The method of claim 1 wherein the thermo-magneto-optic layer comprises terbium, iron and cobalt.

9. The method of claim 1 wherein the plasma treatment is an oxygen glow discharge.

10. The method of claim 1 wherein the plasma treatment is an oxygen etch.

* * * * *